United States Patent
Ni et al.

(10) Patent No.: US 7,297,024 B2
(45) Date of Patent: Nov. 20, 2007

(54) UNIVERSAL-SERIAL-BUS (USB) FLASH-MEMORY DEVICE WITH METAL WRAP FORMED OVER PLASTIC HOUSING

(75) Inventors: Jim Chin-Nan Ni, San Jose, CA (US); Ren-Kang Chiou, Fremont, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 0 days.

(21) Appl. No.: 10/907,700

(22) Filed: Apr. 12, 2005

(65) Prior Publication Data

US 2005/0164532 A1    Jul. 28, 2005

Related U.S. Application Data

(63) Continuation-in-part of application No. 10/907,204, filed on Mar. 24, 2005, now abandoned, and a continuation-in-part of application No. 10/904,207, filed on Oct. 28, 2004, now Pat. No. 7,094,074, and a continuation-in-part of application No. 10/605,146, filed on Sep. 11, 2003, now Pat. No. 6,854,984.

(51) Int. Cl.
*H01R 13/648* (2006.01)

(52) U.S. Cl. .................................... 439/607
(58) Field of Classification Search ........ 439/607–610, 439/76.1, 79; 361/737, 752, 785, 756
See application file for complete search history.

(56) References Cited

U.S. PATENT DOCUMENTS 5,414,597 A    5/1995    Lindland et al. ............ 361/816
6,313,400 B1 *  11/2001   Mosquera et al. ........ 174/35 R
6,671,808 B1 *  12/2003   Abbott et al. ................... 726/4
6,733,329 B2    5/2004    Yang ........................... 439/518
6,757,783 B2    6/2004    Koh ............................ 711/115
6,773,192 B1    8/2004    Chao .......................... 401/195
6,854,984 B1    2/2005    Lee et al. ...................... 439/79
6,940,153 B2 *   9/2005   Spencer et al. ............. 257/659
2002/0116668 A1* 8/2002   Chhor et al. ................. 714/42
2003/0038043 A1* 2/2003   Painsith ..................... 206/234
2004/0137664 A1  7/2004   Elazar et al. ............... 438/127
2004/0143716 A1  7/2004   Hong ......................... 711/170
2004/0153595 A1  8/2004   Sukegawa et al. .......... 710/305
2005/0009388 A1  1/2005   Chao .......................... 439/135

* cited by examiner

*Primary Examiner*—Alexander Gilman
(74) *Attorney, Agent, or Firm*—Bever, Hoffman & Harms, LLP; Patrick T. Bever

(57) ABSTRACT

A metal-wrapped flash-memory-drive device has an integrated slim Universal-Serial-Bus (USB) connector that fits into a standard USB socket. The slim USB connector has 4 metal contacts on a circuit board that is encapsulated by a plastic case. Components are mounted onto the circuit board. A metal wrap conforms to the general shape of a plastic sub-assembly of the plastic case and a plastic cover that enclose the circuit board. The metal wrap can be bent around the plastic sub-assembly in a forming process, or can be pre-formed into a metal tube that the plastic sub-assembly is inserted into. Alignment holes in the metal wrap can fit over plastic stubs on the plastic sub-assembly, or friction can hold the metal wrap to the plastic sub-assembly. The plastic cover and case can be bonded together by molding, ultrasonically, with adhesive films, or using snaps to form the plastic sub-assembly.

12 Claims, 17 Drawing Sheets

TOP VIEW

ULTRASONIC WELDING METHOD

BOTTOM VIEW
SNAP TOGETHER METHOD

TOP VIEW

SNAP TOGETHER METHOD

FINAL ASSEMBLY

SNAP TOGETHER METHOD

BOTTOM VIEW

ONE STEP MOLDING METHOD

TOP VIEW

ONE STEP MOLDING METHOD

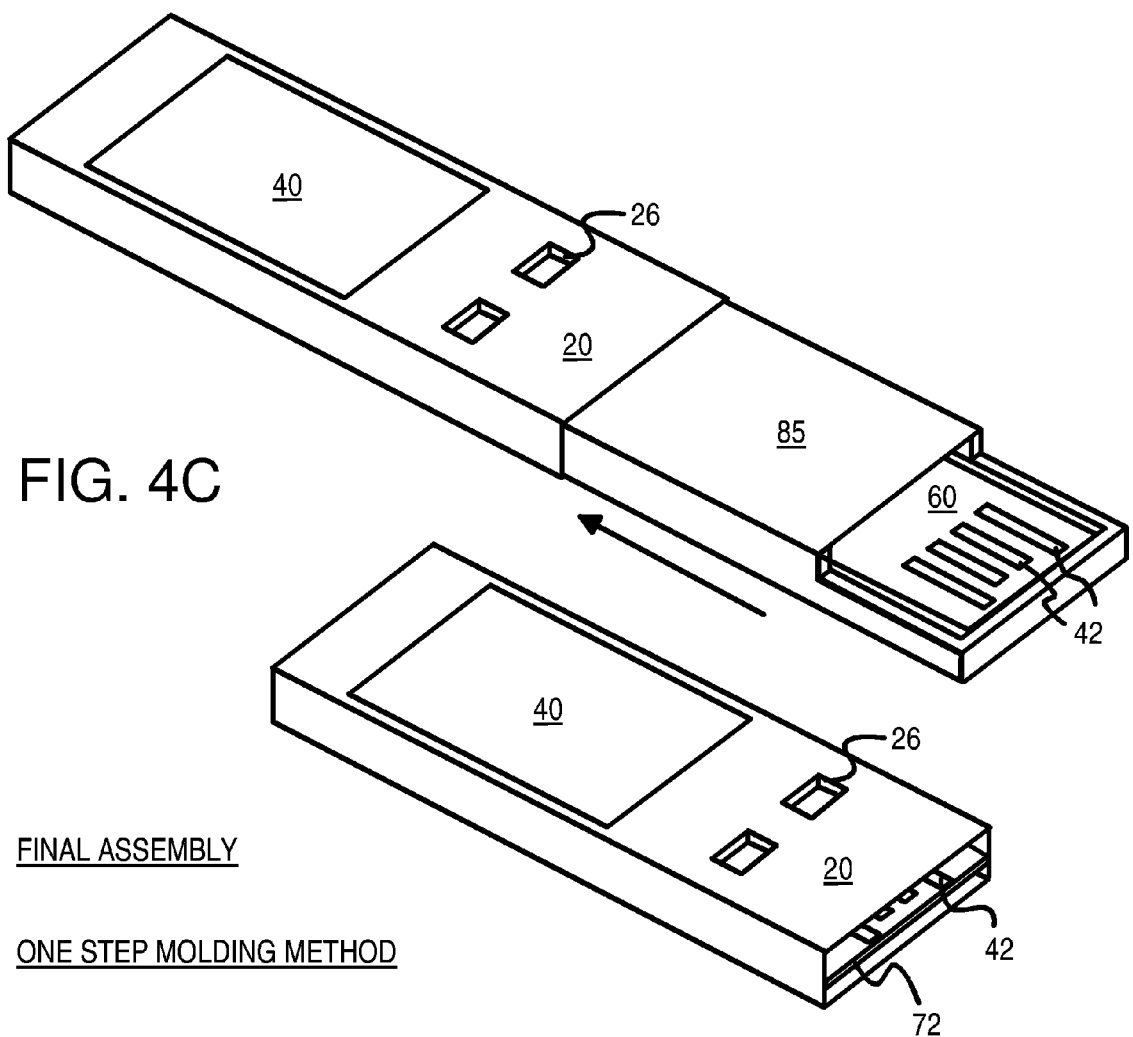

BOTTOM VIEW

TWO STEP MOLDING METHOD

FINAL ASSEMBLY

TWO STEP MOLDING METHOD

BOTTOM VIEW

PCBA WRAPPING METHOD

TOP VIEW

PCBA WRAPPING METHOD

FINAL ASSEMBLY

PCBA WRAPPING METHOD

TUBING

ALTERNATIVE DESIGN

UNIVERSAL-SERIAL-BUS (USB) FLASH-MEMORY DEVICE WITH METAL WRAP FORMED OVER PLASTIC HOUSING

RELATED APPLICATIONS

This application is a continuation-in-part of "Slim USB Connector with Spring-Engaging Depressions, Stabilizing Dividers and Wider End Rails for Flash-Memory Drive", U.S. Ser. No. 10/605,146, filed Sep. 11, 2003, now U.S. Pat. No. 6,854,984, and the application for "Manufacturing Methods for Ultra-Slim USB Flash Memory Card with Supporting Dividers or Underside Ribs", U.S. Ser. No. 10/904,207, filed Oct. 28, 2004 now U.S. Pat. No. 7,094,074, and "Narrow Universal-Serial-Bus (USB) Flash-Memory Card with Straight Sides using a Ball-Grid-Array (BGA) Chip", U.S. Ser. No. 10/907,204, filed Mar. 24, 2005 now abandoned.

FIELD OF THE INVENTION

This invention relates to reduced-size Universal-Serial-Bus (USB) connectors, and more particularly to flash-memory-drive cards having a metal body wrap.

BACKGROUND OF THE INVENTION

Large, 1 G-Byte chips using flash-memory technologies with electrically-erasable programmable read-only memory (EEPROM) are available. Small flash-memory cards have been designed that have a connector that can plug into a specialized reader, such as for compact-flash, secure-digital, memory stick, or other standardized formats.

Recently, flash memory cards are being sold that contain a USB connector. Such USB-flash memory cards do not require a specialized reader but can be plugged into a USB connector on a personal computer (PC) or other hosting device. These USB-flash memory cards can be used in place of floppy disks and are known as USB key drives, USB thumb drives, and a variety of other names. These USB-flash cards can have a capacity of more than ten floppy disks in an area not much larger than a large postage stamp.

FIG. 1 shows a bottom view of assembly of a male slim USB connector that is integrated with a circuit-board substrate of a flash memory card. Flash memory chip 75 may be a 128 Mega-byte non-volatile chip or may have some other capacity. Controller chip 78 contains a flash-memory controller that generates signals to access memory locations within flash memory chip 75. Controller chip 78 also contains a USB interface controller that serially transfers data to and from flash memory chip 75 over a USB connection.

A USB connector may be formed on board 60, which is a small circuit board with chips 75, 78 mounted thereon. Multi-layer printed-circuit board (PCB) technology can be used for board 60. Metal contacts carry the USB signals generated or received by controller chip 78. USB signals include power, ground, and serial differential data D+, D−.

The USB flash-memory card is assembled from PCB board 60 and its components, and lower case 65, which are sandwiched together to form the flash-memory card. The bottom surface of board 60 is visible in FIG. 1.

Flash memory chip 75 and controller chip 78 are mounted on the reverse (bottom) side of board 60, which can be a multi-layer PCB or similar substrate with wiring traces. The 4 USB contacts are formed on the top side of board 60 and are not visible in this bottom view. Since most components are mounted on the bottom side of board 60 opposite the top side with the USB metal contacts, board 60 does not need a plastic cover over its top side. This allows the flash-memory card to have a lower profile or even a co-planar top surface.

Extension 61 of board 60 has a width that approximately matches the width of the connector substrate and the metal wrap in a male USB connector, about 12.4 mm. Metal USB contacts (not visible) are formed on the top side of extension 61 to act as the USB metal contacts of the male slim USB connector. End 72 of board 60 is inserted into the female USB connector.

Lower case 65 also includes extended region 80. LED 93 can be mounted on board 60, such as on the bottom side with other components, or extending from an edge of board 60.

The width of the USB flash-memory drive may flare beyond extension 61, causing a flared or T-shape to the device. This widening of the USB flash-memory device is undesirable.

While traditional USB connectors have metal wraps around a connector substrate, USB flash-memory drives are often made from plastic housings. A USB flash-memory drive may have a metal wrap around extension 61, but a plastic housing such as lower case 65 around for the remaining portion of the USB device. Having the metal-wrapped connector with the plastic housing may be aesthetically unappealing, and the plastic housing may be less durable than the metal-wrapped USB connector. The USB device may crack and fail due to strain at the metal-plastic interface or join between the metal-wrapped USB connector and the plastic housing.

What is desired is a metal-wrapped USB flash-memory device. A USB flash-memory device with a metal cover extending from the USB connector over the plastic housing is desirable.

BRIEF DESCRIPTION OF THE DRAWINGS

FIGS. 4A-C show a 1-step molding process.

DETAILED DESCRIPTION

Figure 1:
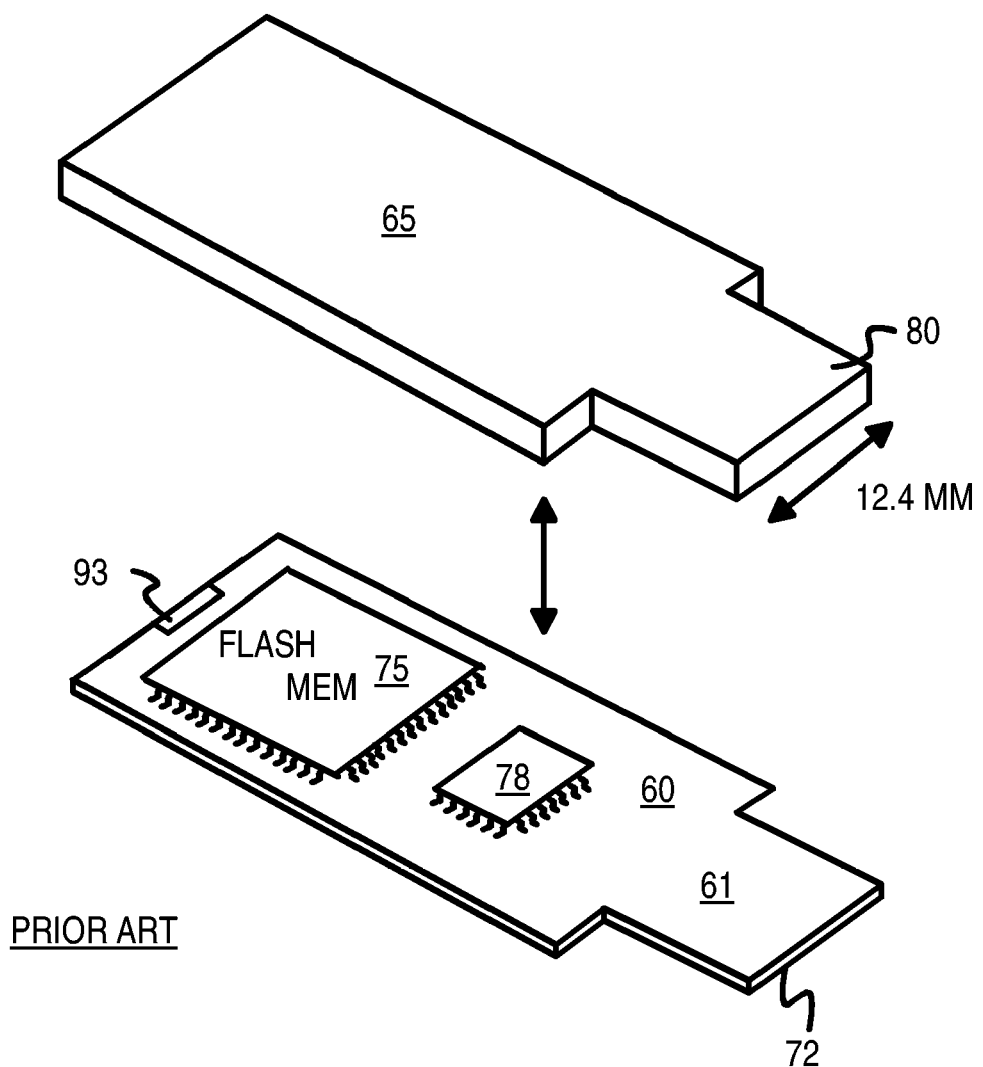
FIG. 1 shows a bottom view of assembly of a male slim USB connector that is integrated with a circuit-board substrate of a flash memory card.

The present invention relates to an improvement in USB flash drives. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that a metal sheet may be wrapped around the plastic housing of a USB flash-memory device. The metal wrap may have the same cross-sectional area as the USB connector, allowing for a smooth-sided device without joints or strain interfaces between the USB connector and the plastic housing.

FIGS. 2A-D show a narrow USB flash-memory device with a metal wrap. Flash memory chip 77 is a 128 Megabyte non-volatile memory chip or may have a die with some other capacity and can be packaged in a variety of packages, such a BGA, small-outline, leadless, etc. Controller chip 79 contains a flash-memory controller that generates signals to access memory locations within flash memory chip 77. Controller chip 79 also contains a USB interface controller that serially transfers data to and from flash memory chip 77 over a USB connection.

Flash memory chip 77 can have a small area. For example, a chip having dimensions of 8.5 mm by 13 mm may be used for flash memory chip 77. Since the narrowest dimension, 8.5 mm, is less than the width of the USB connector, 12.4 mm, flash memory chip 77 does not require a widening of board 60. Instead, board 60 can be 12.4 mm wide for its entire length.

Multi-layer printed-circuit board (PCB) technology can be used for board 60. Metal contacts carry the USB signals generated or received by controller chip 79. USB signals include power, ground, and serial differential data D+, D−.

The USB flash-memory card is assembled from PCB board 60 and its components, case 68, and cover 64, which are sandwiched together to form the flash-memory card. The bottom surface of board 60 is visible in FIG. 2A.

Flash memory chip 77 and controller chip 79 are mounted on the reverse (bottom) side of board 60, which can be a multi-layer PCB or similar substrate with wiring traces. The 4 USB contacts are formed on the top side of board 60 and are not visible in this bottom view.

Board 60 has a width that approximately matches the width of the connector substrate inside the metal wrap of a male USB connector, somewhat less than 12.4 mm. Metal USB contacts (not visible) are formed on the top side of board 60 to act as the USB metal contacts of the male slim USB connector.

LED 38 can be mounted on board 60, such as on the bottom side with other components, or extending from an edge of board 60. A region of reduced thickness (not shown) or an opening may be formed in case 68 to create a light window for LED 38.

Figure 2A:
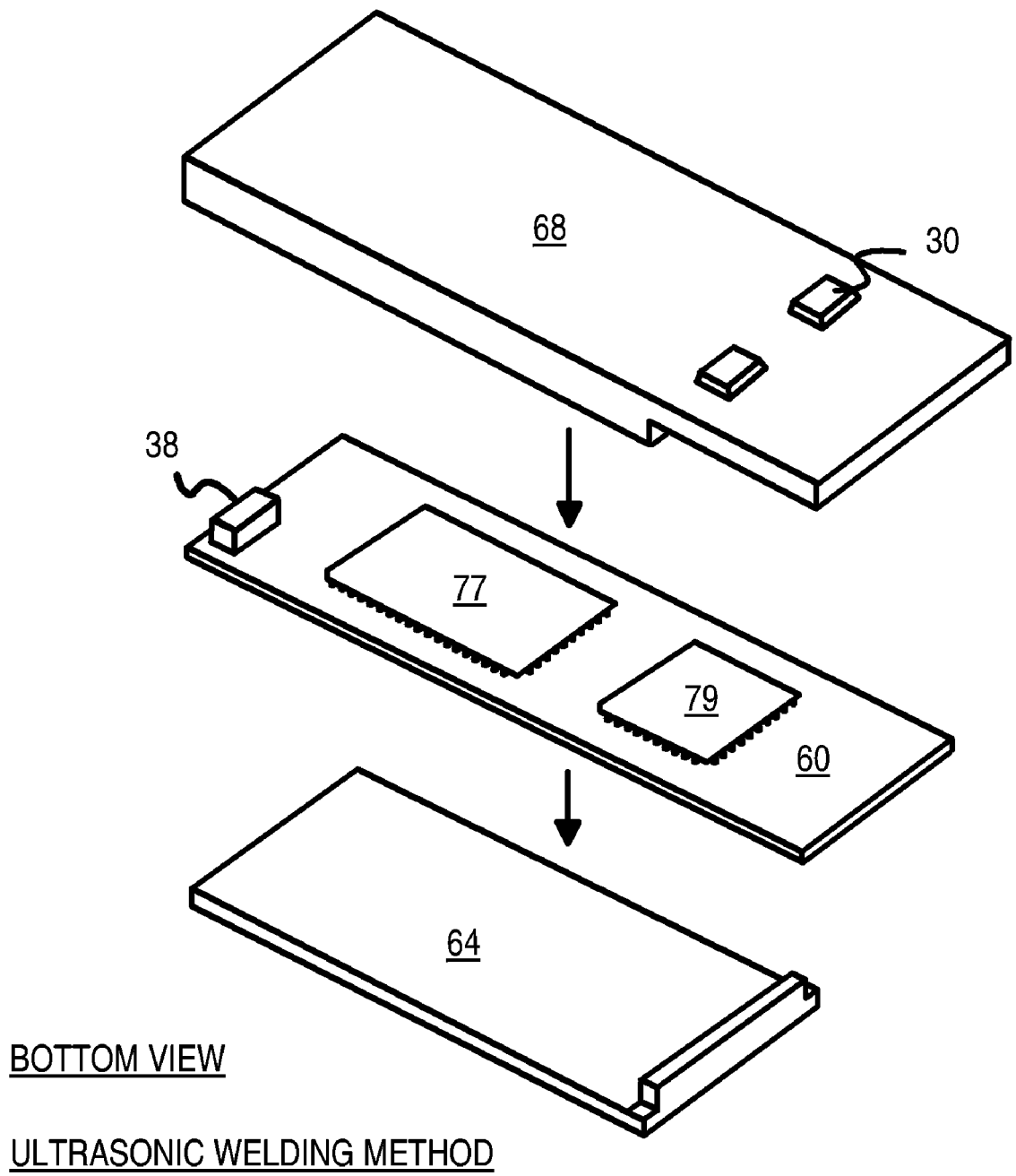
FIGS. 2A-D show a narrow USB flash-memory device with a metal wrap.
Figure 2B:
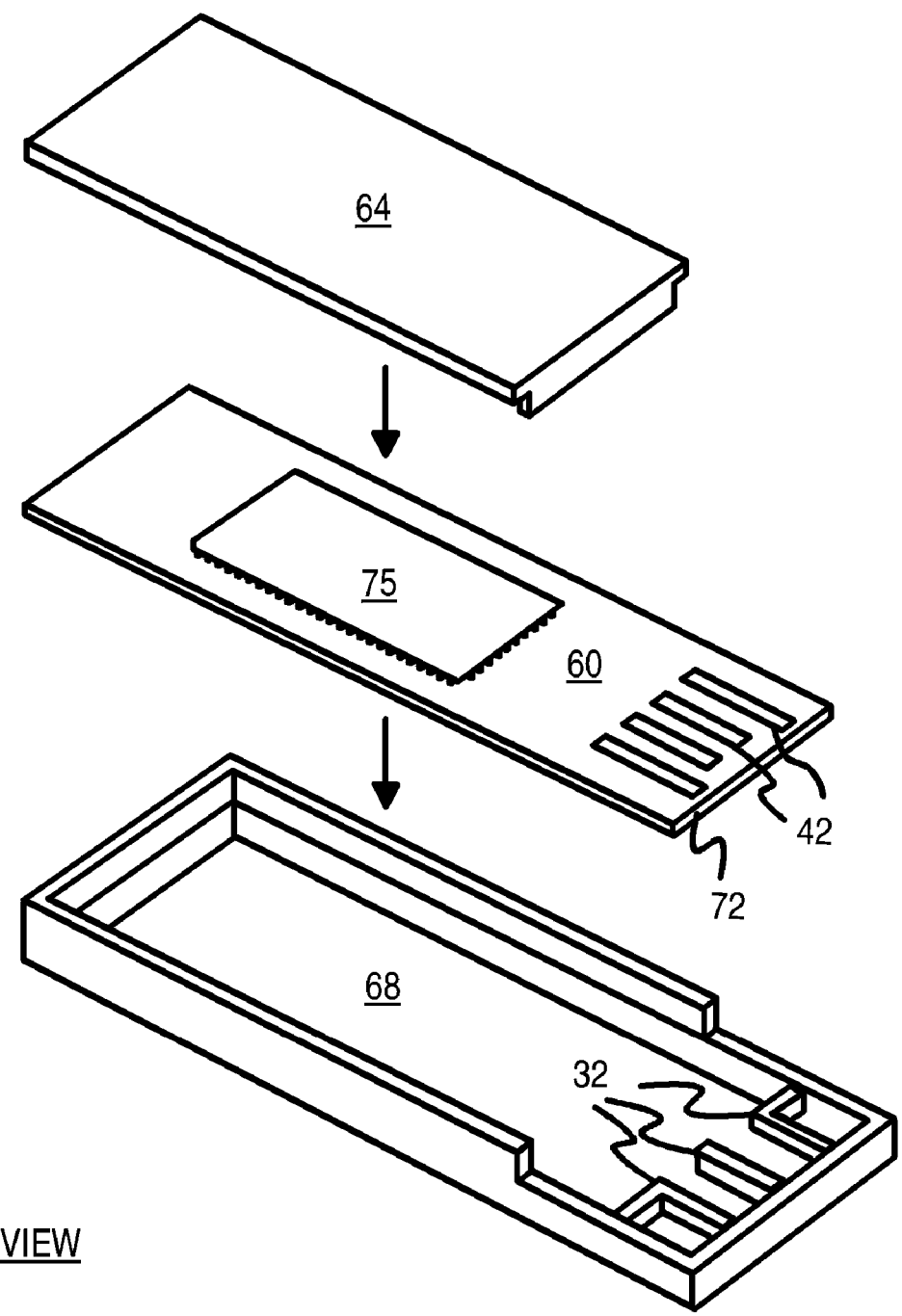

FIG. 2B shows the top view of the USB memory device of FIG. 2A. The 4 USB contacts, metal contacts 42, are formed on the top side of board 60. A second flash-memory chip, memory chip 75, is mounted on the bottom side of board 60. Board 60 is covered by plastic cover 64 over its top side.

Board 60 has a width that approximately matches the width of the connector substrate in a male USB connector. Metal contacts 42 are formed on the top side of board 60 to act as the USB metal contacts of the male slim USB connector. End 72 of board 60 is inserted into the female USB connector.

Case 68 can have grooves in its sidewalls to accept board 60 during assembly. Board 60 can be attached to case 68 by adhesive or by snap fasteners, such as plastic snap pins or tabs in case 68 that fit through and lock into holes in board 60. Adhesive could be a thermal-bond or another type. Supporting ridges 32 in case 68 are located under board 60 near metal contacts 42 to provide additional support to insertion end 72 which forms the USB connector.

Once board 60 is inserted into case 68, and cover 64 is attached, the assembly can be placed in an ultrasonic welding fixture and ultrasonic energy applied. The ultrasonic energy vibrates the parts at high frequency, causing heating at contact points such as ultrasonic ridges (not shown) that can be formed on case 68 or cover 64 at points of contact. These ridges melt under the ultrasonic energy, forming a plastic bonding between case 68 and cover 64.

Figure 2C:
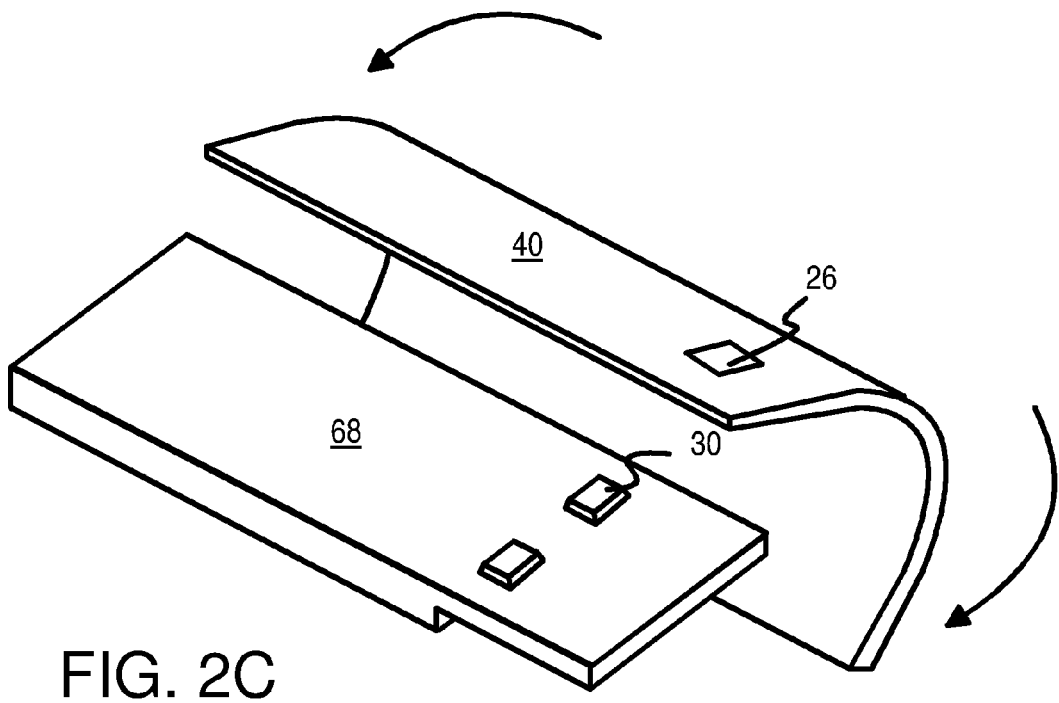

FIG. 2C shows a metal wrap being formed around the plastic USB assembly. Board 60 and cover 64 have been assembled into case 68 but are hidden from view by case 68. Metal wrap 40 can be a metal sheet that is bent around case 68 by a forming process, such as using pressure and heat. Holes 26 in metal wrap 40 can be provided that fit over stubs 30 that protrude from case 68.

Figure 2D:
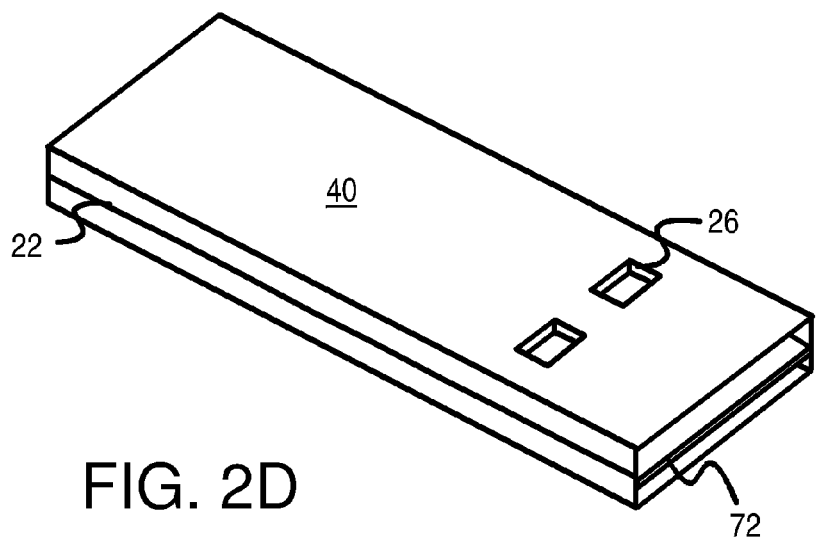

FIG. 2D shows the final assembled USB device with the metal wrap. Metal wrap 40 has been pressed onto the outer surface of case 68 on the top and cover 64 on the bottom so that metal wrap 40 now conforms to the general shape of the plastic assembly of case 68 and cover 64, which enclose board 60. Stubs 30 on case 68 fit into holes 26 in metal wrap 40, helping to align metal wrap 40 to case 68. Additional holes can be provided, such as for the standard USB plug mechanism. End 72 of board 60 is visible in the open end of metal wrap 40.

Metal wrap 40 acts as both the metal wrap of the USB connector, and a metal covering of the plastic assembly (case 68 and cover 64). Seam 22 where the two ends of metal wrap 40 meet can be located on the side rather than the top of case 68 for better visual appearance. Seam 22 can be a straight seam as shown, or can be a serrated or toothed seam.

Figure 3A:
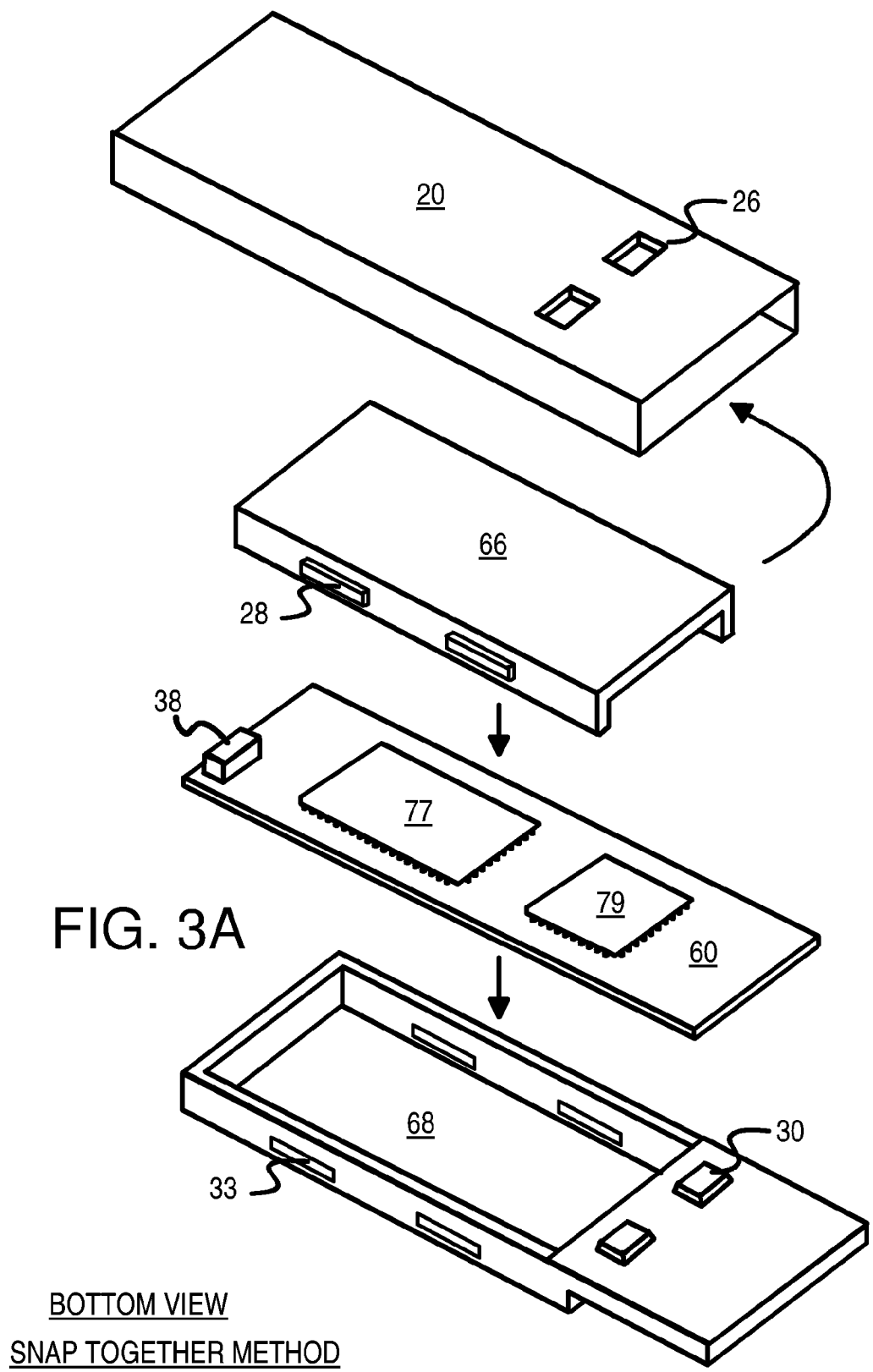
FIGS. 3A-C show assembly using a plastic snap-together process with a metal tube wrap.
Figure 3B:
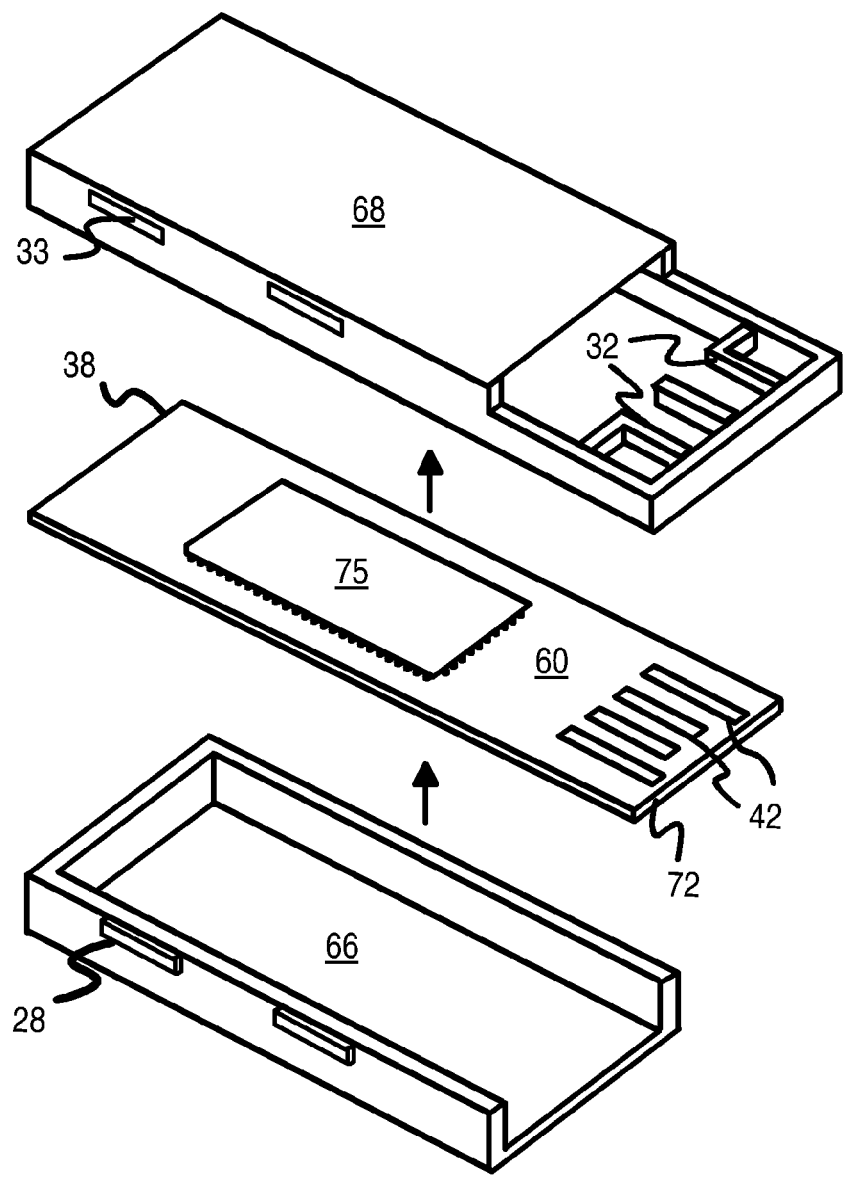
Figure 3C:
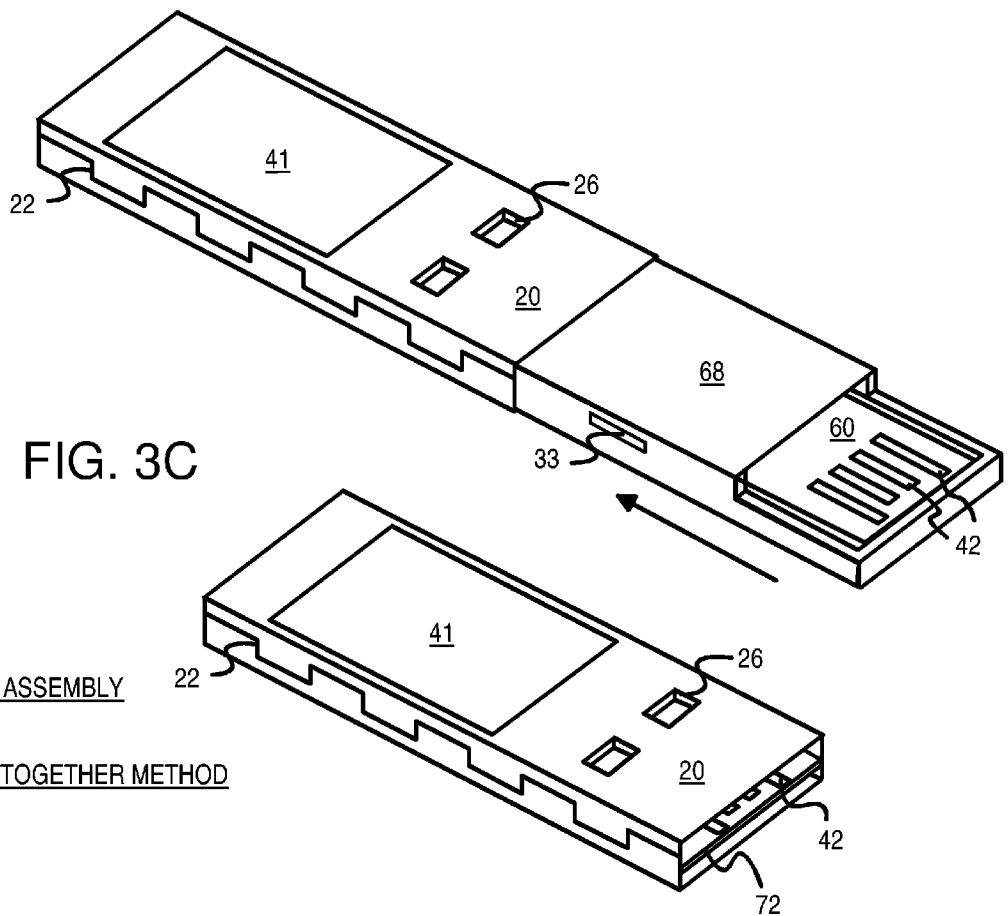

FIGS. 3A-C show assembly using a plastic snap-together process with a metal tube wrap. In the bottom view of FIG. 3A, board 60 is tilted at an angle to have its USB end inserted into case 68. Then board 60 is pushed flat into case 68 and cover 66 is placed over board 60 to cover the large bottom opening in case 68. LED 38 can be mounted on board 60. Flash memory chip 77 and controller chip 79 are mounted to the bottom surface of board 60 and are protected by case 68.

Protruding snaps 28 on cover 66 fit into snap groves 33 in case 68 when assembled. Cover 66 may fit inside case 68 as shown or may fit around the outside of case 68 in an alternative embodiment. Various types of plastic snaps 28 and mating snap grooves 33 may be formed on case 68 and cover 66. Plastic snap tabs may be semi-flexible plastic extensions or protrusion tabs formed on the edges of cover 66 or case 68 and extend upward or downward. Snap grooves or holes may be formed on the peripheral edges of case 68 and match positions of plastic snap tabs in cover 66, or vice-versa.

Once board 60 is assembled into case 68 and cover 66 snapped in to form the plastic sub-assembly, the plastic sub-assembly is fitted into metal wrap tube 20. Alignment holes 26 in metal wrap tube 20 can be provided that fit over stubs 30 that protrude from case 68 once the plastic sub-assembly is fitted into metal wrap tube 20.

In the top view of FIG. 3B, case 68 has a smaller top opening that exposes metal contacts 42 on the top surface of board 60 after assembly. Supporting ridges 32 are visible inside the smaller opening of case 68 and provide mechanical support to the USB connector formed from insertion end 72 of board 60 to prevent damage by rough usage.

A second flash memory chip 75 may be mounted on the top side of board 60 to increase memory storage capacity. The peripheral outline of cover 66 may be somewhat smaller than for case 68 so that cover 66 can fit inside case 68.

During assembly, when board 60 is placed inside case 68, the edge of board 60 may be forced into grooves in the side walls of case 68, which can be covered with adhesive or can have snap tabs that snap through holes in board 60 when board 60 is fully inserted into case 68. This locks board 60 into case 68. A variety of shapes can be used for plastic snap tabs and grooves.

In FIG. 3C, the plastic sub-assembly of case 68, board 60, and cover 66 is slid into one open end of metal wrap tube 20. Snaps in cover 66 fit into snap groves 33 in case 68 when forming the plastic sub-assembly.

In this embodiment metal wrap tube 20 can be pre-formed, with seam 22 along the side edge rather than flat top 41 of metal wrap tube 20. This seam placement has a better appearance. Seam 22 has a tooth arrangement in this embodiment, but could be a straight line or have some other shape.

When the sub-assembly is fully inserted into metal wrap tube 20, stubs 30 from case 68 snap into alignment holes 26 on metal wrap tube 20 to lock the plastic sub-assembly into metal wrap tube 20. Flat top 41 can be a part of metal wrap tube 20 or can be an opening in metal wrap tube 20 that exposes case 68.

The open end of metal wrap tube 20 exposes metal contacts 42 on board 60. Insertion end 72 of board 60 forms the substrate part of the USB connector, while the end of metal wrap tube 20 forms the USB connector's metal wrap. Insertion end 72 can be inserted into a female USB socket, such as on a personal computer.

The final assembly has metal on the outside, since metal wrap tube 20 covers the plastic sub-assembly of case 68, board 60, and cover 66. At least one end of metal wrap tube 20 is open to expose metal contacts 42 on board 60 to form the USB connector plug. The other end of metal wrap tube 20 (hidden from view) can be open or can be closed. Metal wrap tube 20 may fully cover the plastic sub-assembly, or may only partially cover the plastic sub-assembly, such as by having one or more openings.

Figure 4A:
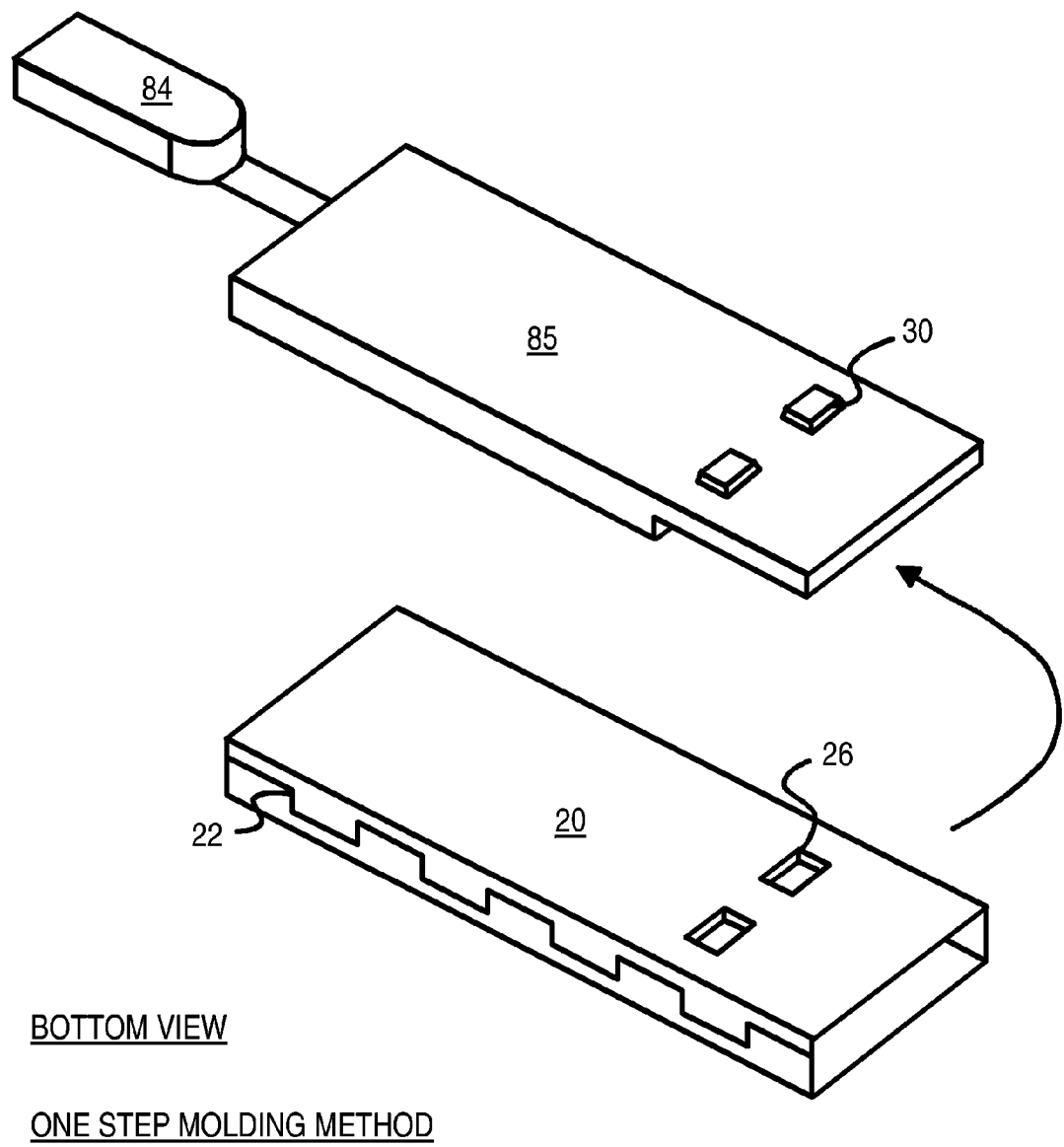
Figure 4B:
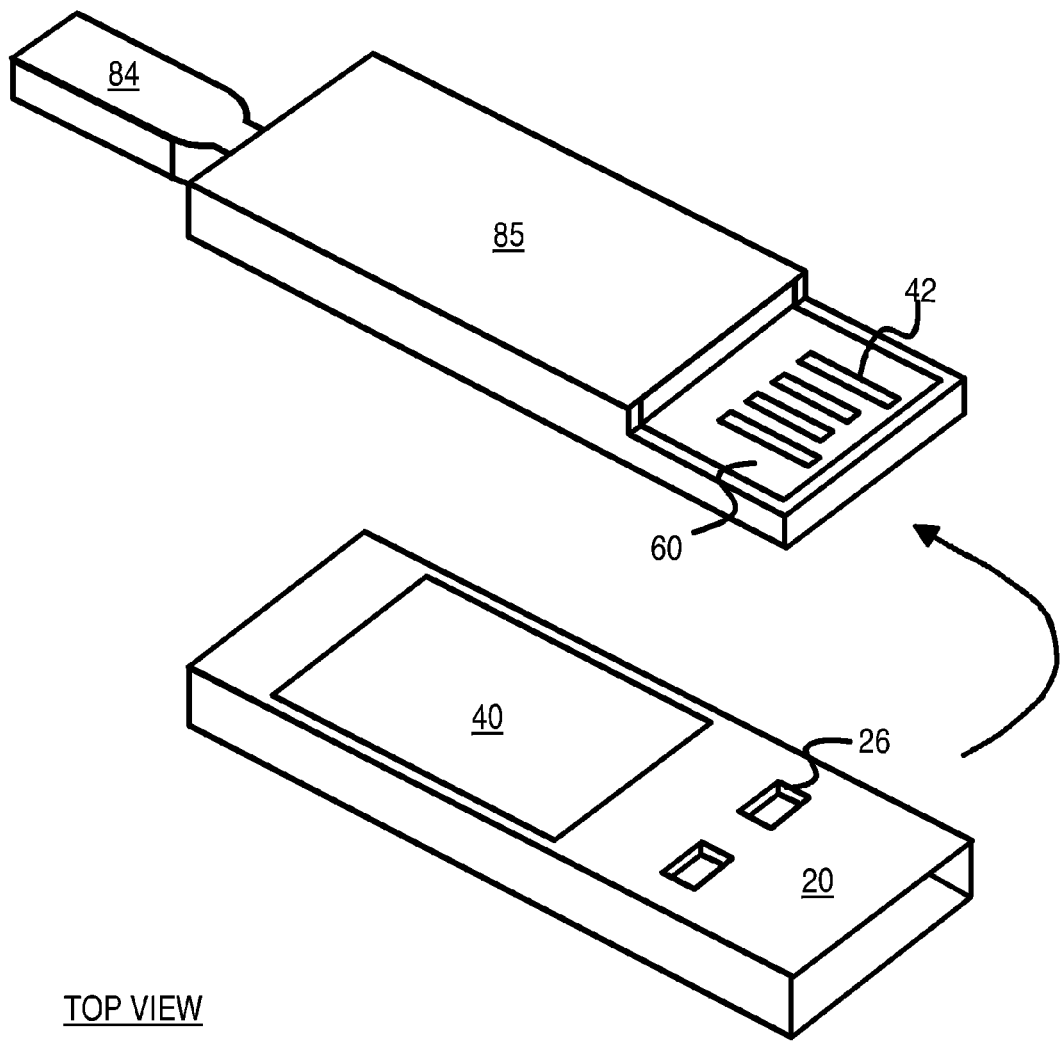

FIGS. 4A-C show a 1-step molding process. In FIG. 4A, board 60 has been assembled with flash memory chip 77 and controller chip 79 both mounted. LED 38 is also optionally mounted to board 60, and metal contacts 42 are formed on the top side of board 60.

Assembled board 60 is placed in a molding fixture (not shown) and plastic is flowed into the fixture, around board 60. After cooling, the molded device is removed from the molding fixture and any burrs and molding handle 84 are removed to reveal the sub-assembled device that has molded plastic casing 85 that surrounds board 60. The molding fixture can prevent plastic from covering metal contacts 42 on board 60, as shown in the bottom view of FIG. 4B.

Plastic stubs 30 can be formed as part of the molding process that forms molded plastic casing 85. These stubs 30 fit into alignment holes 26 on metal wrap tube 20 when molded plastic casing 85 is fitted into metal wrap tube 20. Alternately, a metal sheet can be wrapped around molded plastic casing 85, with the ends of the metal sheet joined together at seam 22. Holes can be pre-cut in the metal sheet that align over stubs 30 during the forming process. Alignment holes 26 can be formed on either or both sides to match locations of stubs 30 in molded plastic casing 85.

In FIG. 4C, the plastic sub-assembly of molded plastic casing 85 that encloses most of board 60 is slid into one open end of metal wrap tube 20.

In this embodiment metal wrap tube 20 can be pre-formed, with seam 22 along the side edge rather than on flat top 41 of metal wrap tube 20. This seam placement has a better appearance.

When molded plastic casing 85 is fully inserted into metal wrap tube 20, stubs 30 from molded plastic casing 85 snap into alignment holes 26 on metal wrap tube 20 to lock the plastic sub-assembly of molded plastic casing 85 into metal wrap tube 20.

The open end of metal wrap tube 20 exposes metal contacts 42 on board 60. Insertion end 72 of board 60 forms the substrate part of the USB connector, while the end of metal wrap tube 20 forms the USB connector's metal wrap. Insertion end 72 can be inserted into a female USB socket, such as on a personal computer.

Figure 5A:
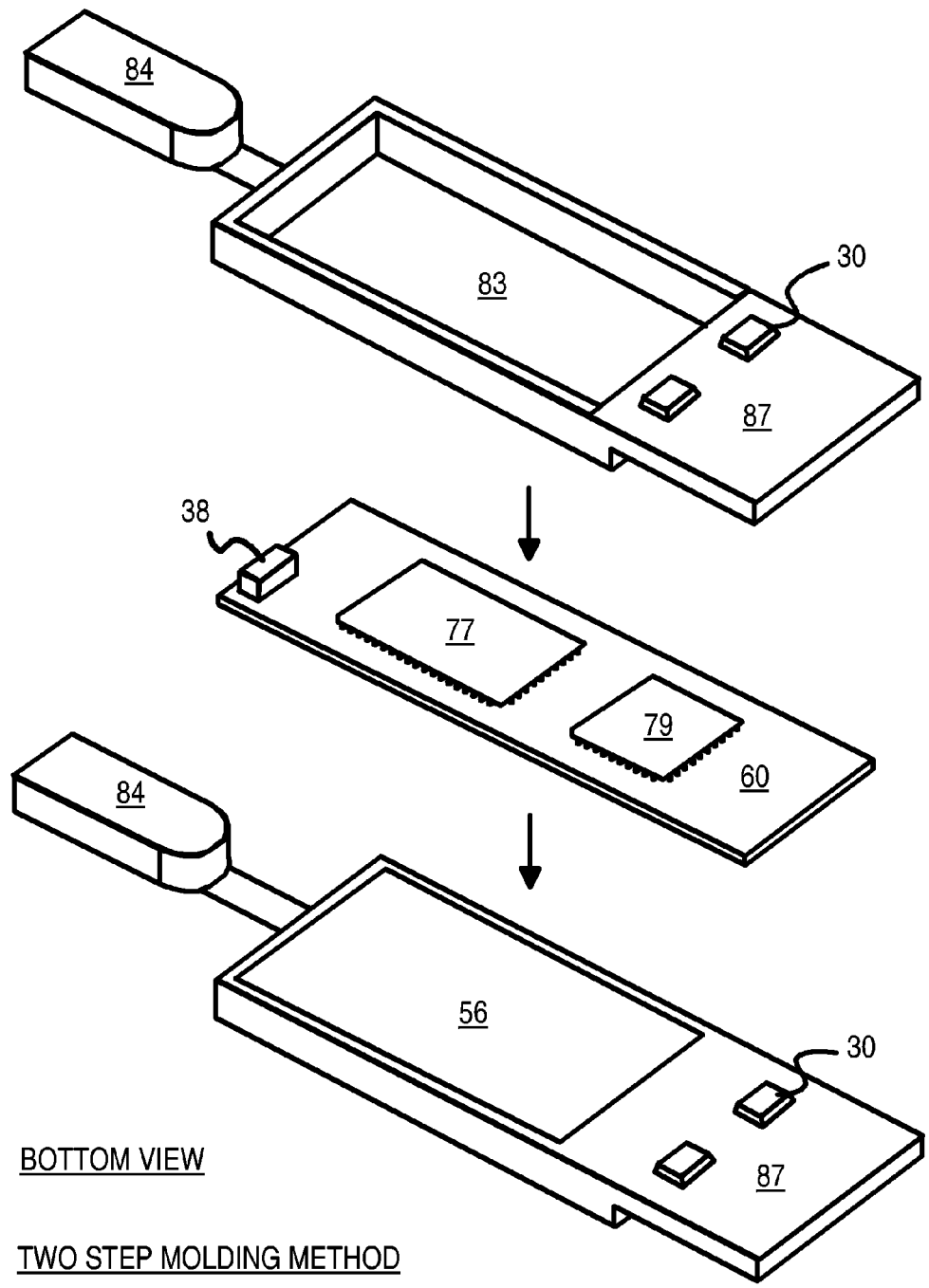
FIGS. 5A-C show a 2-step molding process.
Figure 5B:
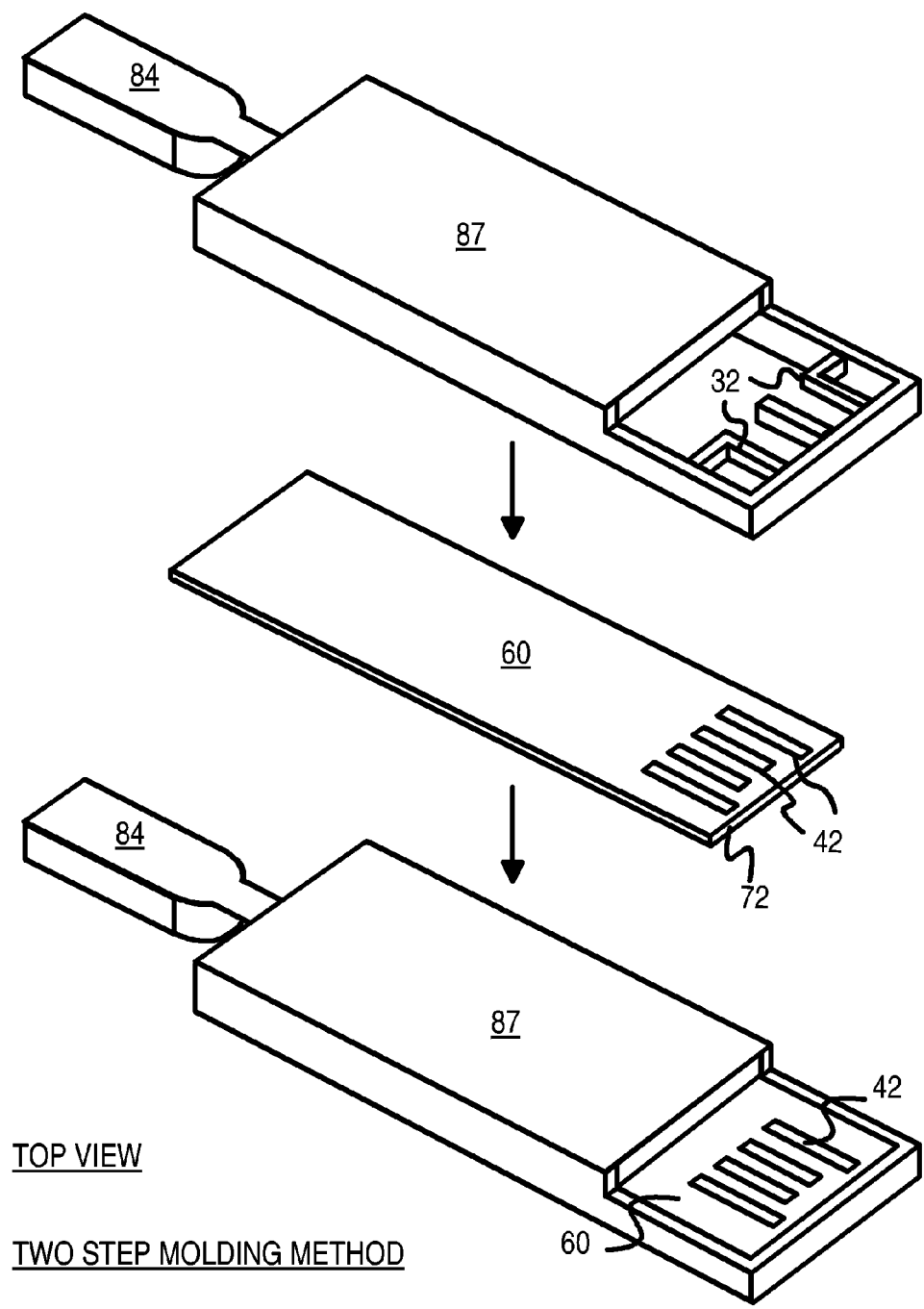
Figure 5C:
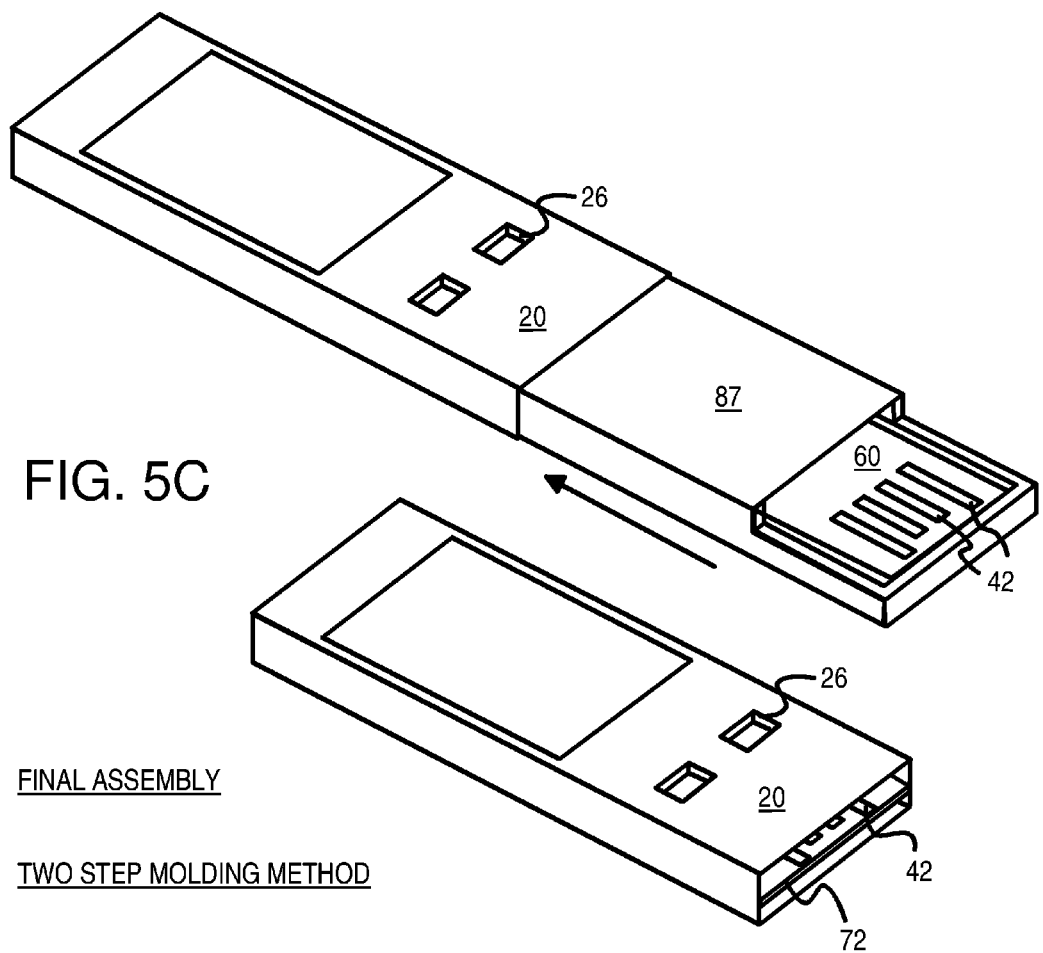

FIGS. 5A-C show a 2-step molding process. In FIG. 5A, board 60 has been assembled with flash memory chip 77 and controller chip 79 both mounted. LED 38 is also optionally mounted to board 60, and metal contacts 42 are formed on the (hidden) top side of board 60.

Assembled board 60 is tilted and inserted into upper opening 83 of molded plastic casing 87, which has previously been molded in a first molding step. Then board 60 and plastic casing 87 are placed in a molding fixture (not shown) and plastic is flowed into the fixture, around board 60 and plastic casing 87. This second molding step forms molded cover 56 over upper opening 83 in plastic casing 87.

After cooling, the molded device is removed from the molding fixture and any burrs and molding handle 84 are removed to reveal the final assembled device that has molded plastic cover 56 molded into plastic casing 87 that surrounds board 60. The molding fixture can prevent plastic from covering metal contacts 42 on board 60, as shown in FIG. 5B. Supporting ridges 32 inside plastic casing 87 provide mechanical support to insertion end 72 or board 60 around metal contacts 42.

In FIG. 5C, the plastic sub-assembly of plastic casing 87 and molded cover 56 that encloses most of board 60 is slid into one open end of metal wrap tube 20. Metal wrap tube 20 can be pre-formed, with seam 22 along the side edge rather than on flat top 41 of metal wrap tube 20.

When plastic casing 87 is fully inserted into metal wrap tube 20, stubs 30 from plastic casing 87 snap into alignment holes 26 on metal wrap tube 20 to lock the plastic sub-assembly of plastic casing 87 into metal wrap tube 20.

The open end of metal wrap tube 20 exposes metal contacts 42 on board 60. Insertion end 72 of board 60 forms the substrate part of the USB connector, while the end of metal wrap tube 20 forms the USB connector's metal wrap. Insertion end 72 can be inserted into a female USB socket, such as on a personal computer.

Figure 6A:
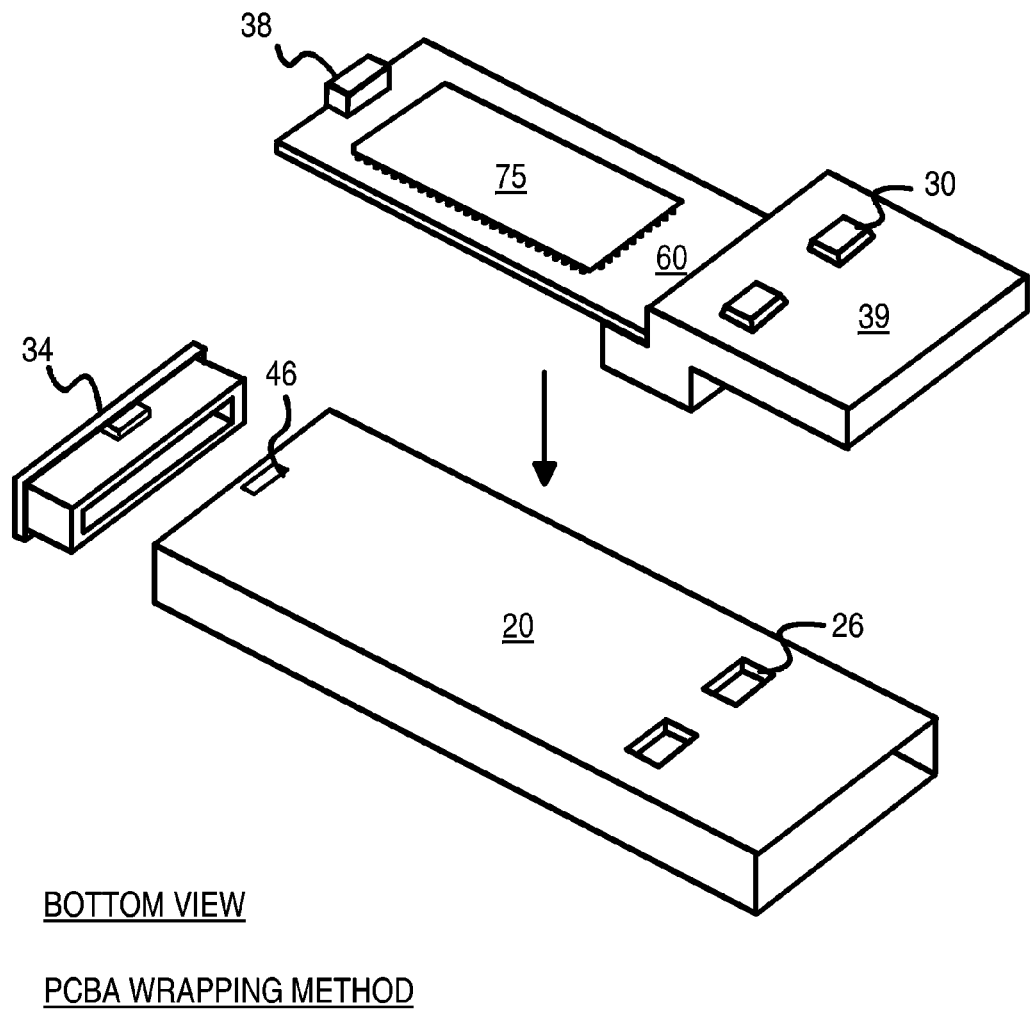
FIGS. 6A-C show assembly using a PCB-assembly metal-wrapping process.
Figure 6B:
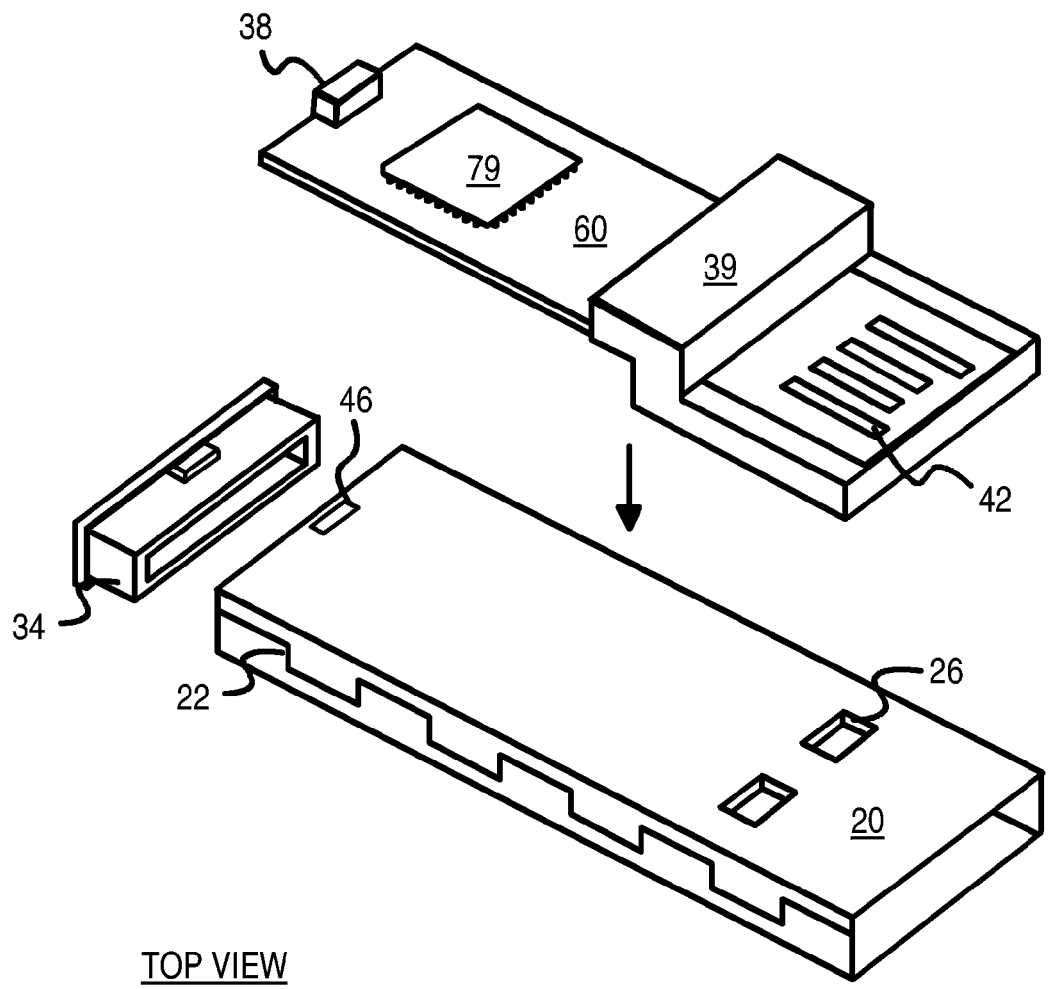
Figure 6C:
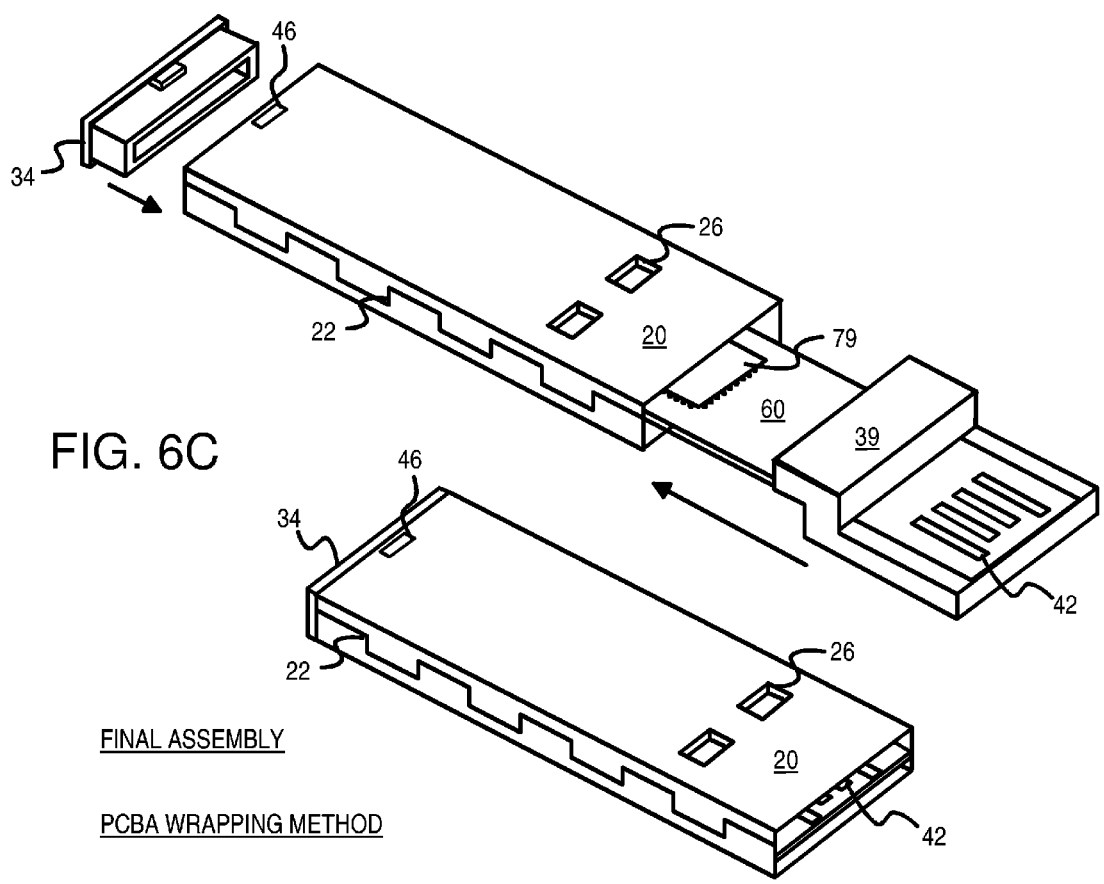

FIGS. 6A-C show assembly using a PCB-assembly metal-wrapping process. In the bottom view of FIG. 6A, board 60 is attached to connector substrate 39. The edge of board 60 can fit into groves or clips on connector substrate 39. Connector substrate 39 can be a molded or formed plastic part or can be made from ceramic or other material.

LED 38 can be mounted on board 60. Flash memory chip 75 is mounted to the bottom surface of board 60 and are protected by metal wrap tube 20. Stubs 30 can fit into alignment holes 26 in metal wrap tube 20.

End cap 34 can be a plastic molding with a shape to fit into the far open end of metal wrap tube 20. End cap 34 can have a stub or snap to fit into hole 46 on metal wrap tube 20 to clip end cap 34 into place. End cap 34 can have a thin section or opening to let light from LED 38 out.

Once board 60 is assembled into connector substrate 39 to form the sub-assembly, the sub-assembly is inserted into metal wrap tube 20. Alignment holes 26 in metal wrap tube 20 can be provided that fit over stubs 30 that protrude from connector substrate 39 once the sub-assembly is fitted into metal wrap tube 20.

In the top view of FIG. 6B, connector substrate 39 has a stair-step shape with metal contacts 42 formed on the top surface of connector substrate 39. Electrical connecting traces within or on connector substrate 39 can connect signals from the edge of board 60 to metal contacts 42. Controller chip 79 may be mounted on the top side of board 60.

Connector substrate 39 can have a thickness approximately matching the inside thickness of metal wrap tube 20. Thus connector substrate 39 firmly fits inside metal wrap tube 20, providing support for board 60. The other end of board 60 can fit into a slot on the inside of end cap 34. A variety of shapes can be used for end cap 34 and connector substrate 39.

In FIG. 6C, the sub-assembly of connector substrate 3 and board 60 is slid into one open end of metal wrap tube 20. In this embodiment metal wrap tube 20 can be pre-formed, with seam 22 along the side edge rather than the flat top of metal wrap tube 20. Seam 22 has a tooth arrangement in this embodiment, but could be a straight line or have some other shape.

When the sub-assembly is fully inserted into metal wrap tube 20, stubs 30 from connector substrate 39 snap into alignment holes 26 on metal wrap tube 20 to lock the sub-assembly into metal wrap tube 20. End cap 34 also is snapped into the far end of metal wrap tube 20 and locks into hole 46 and over board 60.

The open end of metal wrap tube 20 exposes metal contacts 42 on connector substrate 39. A flat surface of connector substrate 39 forms the substrate part of the USB connector, while the end of metal wrap tube 20 forms the USB connector's metal wrap. This end can be inserted into a female USB socket, such as on a personal computer.

The final assembly has metal on the outside, since metal wrap tube 20 covers the sub-assembly of connector substrate 39 and board 60. One end of metal wrap tube 20 is open to expose metal contacts 42 on connector substrate 39 to form the USB connector plug. The other end of metal wrap tube 20 is covered by end cap 34. Metal wrap tube 20 may fully cover the plastic sub-assembly, or may only partially cover the plastic sub-assembly, such as by having one or more openings. Although board 60 is not covered by plastic cases, it is still protected by metal wrap tube 20.

Figure 7:
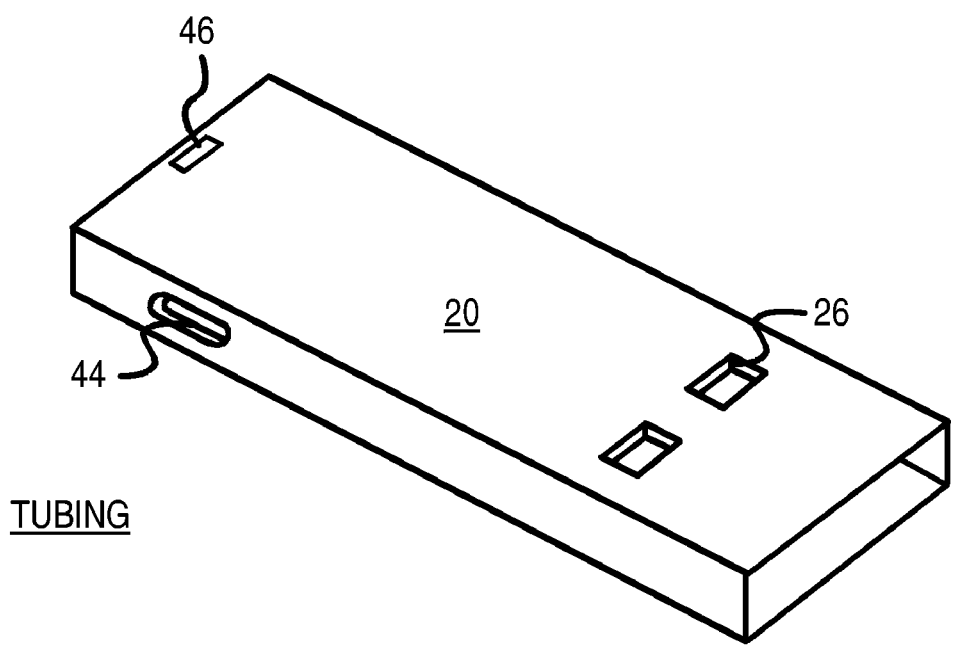
FIG. 7 shows an alignment hole on the side of the metal wrap tube.

FIG. 7 shows an alignment hole on the side of the metal wrap tube. Side hole 44 is cut in the side metal wrap tube 20 and fits over a side stub on the side of plastic case 68, molded plastic casing 85, plastic casing 87, or connector substrate 39. Hole 46 can fit over a clip in end cap 34.

Figure 8:
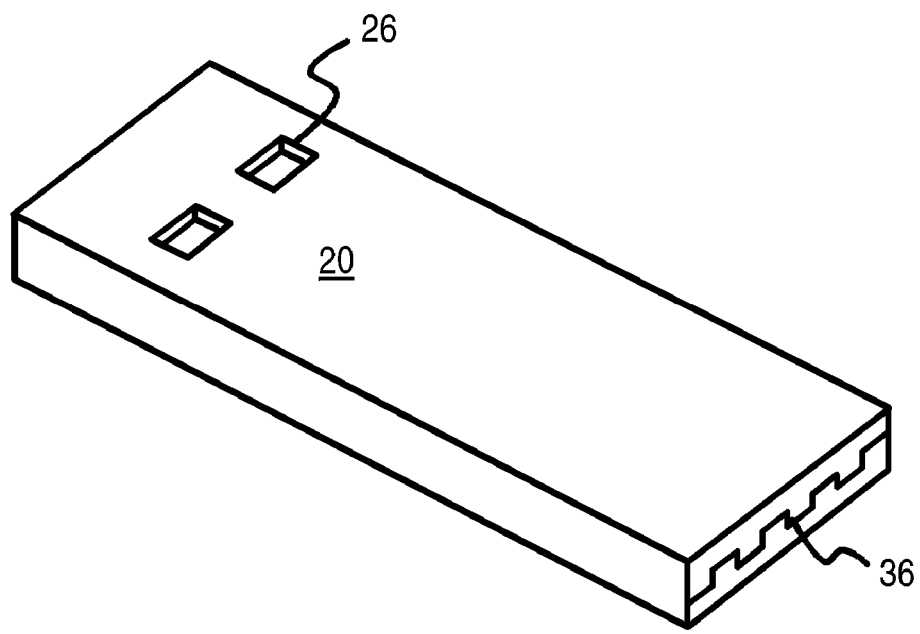
FIG. 8 shows an alternative metal wrap tube with a metal end.

FIG. 8 shows an alternative metal wrap tube with a metal end. Rather than use plastic end cap 34, metal from metal wrap tube 20 can be bent and formed over the end to cover the end. End seam 38 is formed on the end where 2 extensions of metal wrap tube 20 meet. Alignment holes 26 can fit over stubs in the underlying plastic sub-assembly.

Lead-Free-Process Considerations

The element lead (Plumbium, Pb) is indicated as a hazardous material. Legislatives would like to remove this material within a couple of years, such as from the European Union and Japan after January 2008 or earlier.

The traditional USB plug which has plastic substrate during PCBA process will be shrunk and warped at a temperature of about 240° C. (peak temp of lead-free solder paste), therefore such a USB plug is not suitable for lead-free process.

The slim USB plug doesn't have the plastic substrate during PCBA process and uses a different PCB material to provide a better temperature resistance to the peak temp of 240° C. of the lead-free process. For lead-free processes, surface mount components as well as BGAs don't contain lead in their pins or balls. After the PCBA process, the plastic housing is added and assembled to finish the final product.

ALTERNATE EMBODIMENTS

Several other embodiments are contemplated by the inventors. For example controller chip 79 could be combined with flash memory chip 77 in a single BGA, small-outline, leadless, or other kind of package. Rather than use a chip package, the flash-memory die could be directly attached to board 60 with die-wire bonding.

An adhesive film can be placed inside cover 66, and the film can be placed inside case 68 before board 60 is fitted into case 68 and cover 66 attached and snapped into place. Protective backing from the films can be peeled off just before attachment, and double-sided adhesive films may be used. Adhesive films may be pressure-sensitive or heat-sensitive, but may not be used in all embodiments, such as when snaps are fully secure.

Rather than use a second molding step to add molded cover 56 to upper opening 83 of plastic casing 87, this second molding step could be skipped. Metal wrap tube 20 could provide sufficient covering for upper opening 83. Alignment holes 26 and stubs 30 may not be needed in all embodiments. Friction between metal wrap tube 20 and the plastic sub-assembly may be sufficient for holding metal wrap tube 20 onto the inner plastic parts.

Additional holes, slots, and other features may be added to the metal wrap or plastic sub-assembly parts. For example, two rectangular USB holes may be added to the top of the USB connector and two more holes may be added to the bottom of the USB connector metal wrap tube near the plug end. These extra holes are present in many USB plugs.

Rather than use the USB device only for flash-memory storage, additional features may be added. For example, a USB music player may include a controller for playing audio from MP3 data stored in the flash memory. An audio jack may be added to the USB device to allow a user to plug in headphones to listen to the music. A wireless transmitter such as a BlueTooth transmitter may be added to the USB device to connect to wireless headphones rather than using the audio jack. Infrared transmitters such as for IrDA may also be added. A BlueTooth transceiver to a wireless mouse, PDA, keyboard, printer, digital camera, MP3 player, or other wireless device may also be added. The BlueTooth transceiver could replace the USB connector as the primary connector. A Bluetooth USB adapter device could have a USB connector, a RF (Radio Frequency) transceiver, a baseband controller, an antenna, a flash memory (EEPROM), a voltage regulator, a crystal, a LED (Light Emitted Diode), resistors, capacitors and inductors. These components may be mounted on the PCB before being enclosed into a plastic or metallic enclosure.

The bottom opening of case 68 may be enlarged so that case 68 is fully open to its perimeter on the bottom. Then cover 56 may be extended to cover this larger opening.

Inserting board 60 into case 68 may be easier with the larger opening. The larger opening may also be used in other embodiments. Also, board 60 may not have a cover over it.

Rather than or in addition to snap tabs, adhesive can be used. Pressure or heat sensitive adhesive films can be attached to board 60 or to case 68 where bonding is desired. For example, an adhesive could be brushed on as a liquid or paste, or it could be a double-coated adhesive film such as 3M's 7953 film. A thermal bond film (TBF) such as 3M's TBF-668 could also be used.

Once board 60 and case 68 are pressed together with board 60 in between, the adhesive can be cured by heating the assembly, by pressing the case and board together, or by allowing sufficient time for curing.

Board 60 could also be mounted over the tops of side walls of a lower case. In that variation the edges of board 60 are exposed rather than covered by case 68. In some embodiments board 60 could be the same area or ever larger than case 68, or vice-versa.

Snap-tabs with movable latching teeth or extensions or locking portions may also be used. Different thicknesses and dimensions can be substituted for the examples given. The narrow USB device may have a somewhat varying width, such as within +/−20% of the width at the insertion end.

Various design features such as supporting underside ribs or bumps can be added. A variety of materials may be used for the connector substrate, circuit boards, metal contacts, case, etc. Plastic cases can have a variety of shapes and may partially or fully cover different parts of the circuit board and connector, and can form part of the connector itself. Metal covers rather than plastic may be used in some embodiments. Various features can have a variety of shapes and sizes. Oval, round, square, rectangular, trapezoidal, and other shapes may be used.

The slim connector may be widened to accommodate extra metal contacts to become an extended-USB connector for future USB specification. Moreover, the width of the slim connector can be widened, and the height and metal contacts of the slim connector can be varied, making it into a general-purpose slim connector, for USB, extended-USB, PCI Express, mini PCI Express applications, etc.

There are 4 pins in the current USB pin out definition— VCC, GND, D+, and D−. VCC is the 5V power pin. GND is the ground pin and D+ and D− are the differential data I/O pins. For the USB 2.0 specification, data transfer rates are up to 480M bits/sec, and the power supply current is 500 mA. These might not meet future (or even some current) needs of speed and power associated with some USB devices, such as large flash memory cards.

Additional metal contacts can be added to the new connectors. These additional metal contacts can serve as power, ground, and/or I/O pins which are extensions to the USB specification, or as PCI Express (or mini PCI Express) specifications. Greater power capability can be obtained with (or without) additional power and ground pins (or by a higher power supply current of the existing power pin). Multiple power supplies can also be provided by the additional power and ground pins. The improved power supply capabilities allow more devices and/or more memory chips to be powered. Extra I/O pins can be added for higher bandwidth and data transfer speeds. The additional I/O pins can be used for multiple-bit data I/O communications, such as 2, 4, 8, 12, 16, 32, 64, . . . bits. By adopting some or all of these new features, performance of flash memory cards/ devices can be significantly improved. These additional pins could be located behind or adjacent to the existing USB pins, or in various other arrangements. The additional pins could be applied to male and female connectors. New types of flash memory cards/devices can be made with these new connectors, which have the additional pins.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A Universal-Serial-Bus (USB) flash-memory device comprising:

a printed circuit board assembly including an elongated printed circuit board (PCB) having an insertion end and a rear end opposite to the insertion end, metal contacts disposed on a top surface of the PCB in a contact region located adjacent to the insertion end, and at least one integrated circuit electrically connected to and mounted on the PCB adjacent to the rear end;

a plastic housing having a front portion and a rear portion, a flat bottom wall that extends under both the front and rear portions, a flat top wall that extends only over the rear portion, rear side wall portions extending upward from the bottom wall to the top wall in the rear portion, and front side wall portions and a front wall portion extending upward from the bottom wall in the front portion, wherein the front side wall portions and the front wall portion are shorter than the rear wall portions; and a metal wrap having a flat lower metal sheet, flat side metal sheets respectively connected at opposite sides of the lower metal sheet and extending substantially perpendicular to the lower metal sheet, and a flat upper metal sheet attached to upper ends of the side metal sheets, whereby the metal wrap defines an elongated interior region having a substantially rectangular cross-section, and front edges of the lower, side and upper metal sheets collectively define a front opening, wherein the printed circuit board assembly is substantially encapsulated inside the plastic housing such that the rear end is enclosed by the rear portion of the plastic housing, and a bottom surface of the PCB adjacent to the insertion end is covered by the front portion of the plastic housing, wherein only the contact region of the top surface of the PCB is exposed outside the plastic housing, and wherein the plastic housing is slidably inserted inside the metal wrap such that, when both the rear portion and the front portion of the plastic housing are located inside the interior region of the metal wrap, the bottom, side and top walls of the plastic housing respectively contact the lower, side and upper metal sheets of the metal wrap, and wherein the device further comprises means for securing the plastic housing to the metal wrap when the front wall of the plastic housing is aligned with the front opening of the metal wrap.

2. The USB flash-memory device according to claim 1, wherein a front edge of the metal wrap defines an opening that conforms with the height and width of a standard USB male connector.

3. The USB flash-memory device according to claim 1, wherein said means for securing comprises:

one or more stubs protruding from at least one of the bottom and top walls of the plastic housing, one or more alignment holes defined in at least one of the bottom and top metal sheets of the metal wrap, wherein the plastic housing has a thickness that is sized relative to a height of the interior region of the metal wrap and said one or more stubs and one or more alignment holes are positioned such each of said one or more stubs protrudes into a corresponding one of said one or more alignment holes when the front wall of the plastic housing is aligned with the front opening of the metal wrap.

4. The USB flash-memory device according to claim 1, wherein the metal wrap comprises a flat metal sheet that is bent around the plastic housing to conform the metal wrap to a shape of the plastic housing.

5. The USB flash-memory device according to claim 1, wherein the metal wrap has the first width for an entire length of the substrate board, wherein the metal wrap has a constant width that is substantially determined by the integrated slim Universal-Serial-Bus (USB) connector.

6. The USB flash-memory device according to claim 1, wherein the plastic housing comprises molded plastic disposed around the PCB.

7. The USB flash-memory device according to claim 1, wherein the plastic housing comprises a case having means for receiving the rear end of the PCB, and a cover that is secured to the case by one of an adhesive, snap fasteners, and a thermal bond film.

8. The USE flash-memory device according to claim 1, wherein the printed circuit board assembly further comprises a light-emitting diode disposed on the rear end of the PCB, wherein the plastic housing includes a rear wall defining light window that is disposed adjacent to the light-emitting diode, wherein the rear edges of the lower, side and upper metal sheets collectively define a rear opening of the metal wrap, and wherein the plastic housing is disposed in the metal wrap such that the light window is visible through the rear opening of the metal wrap.

9. The USB flash-memory device according to claim 1, wherein the rear edges of the lower, side and upper metal sheets collectively define a rear opening of the metal wrap, and wherein the device further comprises an end cap mounted to the metal wrap such that the end cap covers the rear opening.

10. The USB flash-memory device according to claim 1, wherein the metal wrap further comprises a rear metal sheet connected to rear edges of the lower, side and upper metal sheets.

11. The USB flash-memory device according to claim 1, wherein the at least one integrated circuit comprises a non-volatile memory device.

12. The USB flash-memory device according to claim 11, wherein the at least one integrated circuit further comprises a controller device.

* * * * *